United States Patent [19]

Milkovic et al.

[11] Patent Number: 4,556,843
[45] Date of Patent: Dec. 3, 1985

[54] ELECTRONIC SOLID STATE Q-HOUR METER AND/OR COMBINATION Q-HOUR AND KILOWATT-HOUR METER

[75] Inventors: Miran Milkovic, Scotia, N.Y.; Anthony P. Bogacki, Chester, N.H.

[73] Assignee: General Electric Company, Somersworth, N.H.

[21] Appl. No.: 475,952

[22] Filed: Mar. 16, 1983

[51] Int. Cl.$^4$ .............................................. G01R 21/06
[52] U.S. Cl. ................................... 324/107; 324/141; 324/142
[58] Field of Search ............... 324/141, 142, 107, 130; 364/483, 842

[56] References Cited

U.S. PATENT DOCUMENTS 4,056,775 11/1977 Milkovic .............................. 364/483
4,408,283 10/1983 Kovalchik et al. .................. 324/142

OTHER PUBLICATIONS

Hope et al.; "Microprocessor-Based . . . "; Electrical Power and Energy Systems; vol. 3; No. 2; Apr. 1981; pp. 75–84.
Gambell, C. E.; "Q-Metering"; Distribution Magazine; Jan. 1970; pp. 9–12.

Primary Examiner—Ernest F. Karlsen
Attorney, Agent, or Firm—Robert E. Brunson

[57] ABSTRACT

An electronic solid state Q-hour meter for measuring leading and lagging VARS quantities of electric power over a defined range of power factor. The Q-hour meter comprises first and second time division/pulse width-amplitude modulated/analog multiplier circuits. First and second current transformers are coupled to first and second phases of a multi-phase power supply to be monitored for deriving first and second analog circuit indicating signals which are supplied to respective analog current input terminals of the analog multipliers. First and second potential transformers are coupled across the first and second phases of the multi-phase power supply for deriving first and second analog voltage indicating signals that are supplied to respective input terminals of the first and second analog multiplier circuits. An electronic phase shifting circuit is connected intermediate the output of one of the potential transformers and the input terminal to one of the analog multiplier circuits for shifting the phase of the voltage indicating signal supplied thereto sixty degrees lagging. The outputs of the analog multiplier circuits are summed together to derive an output analog signal representative of a leading and lagging VARS quantities of electric power. By combining the solid state Q-hour meter with an electronic solid state kilowatt-hour meter a combination meter capable of measuring both kilowatt hours and Q-hours is provided.

16 Claims, 8 Drawing Figures

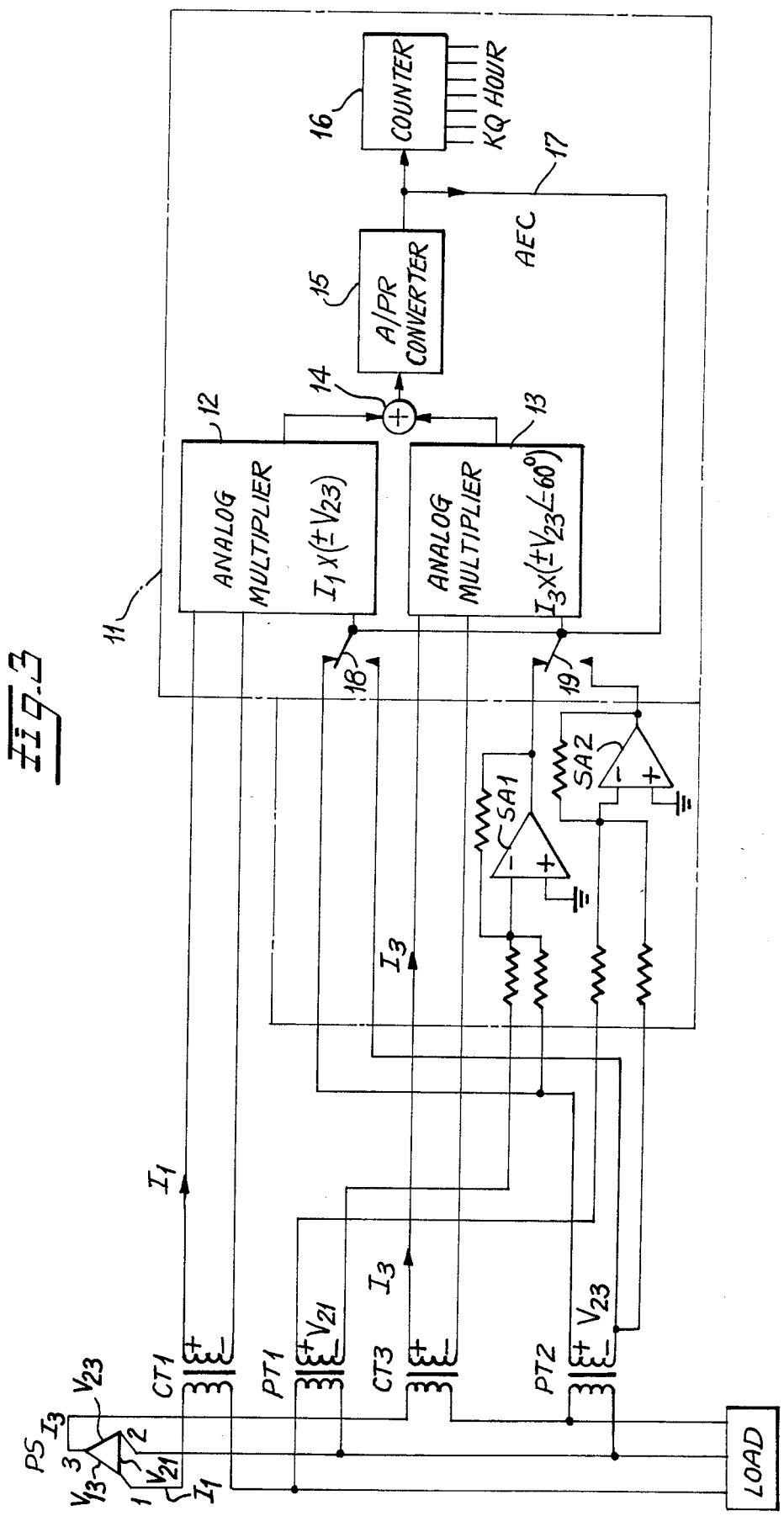

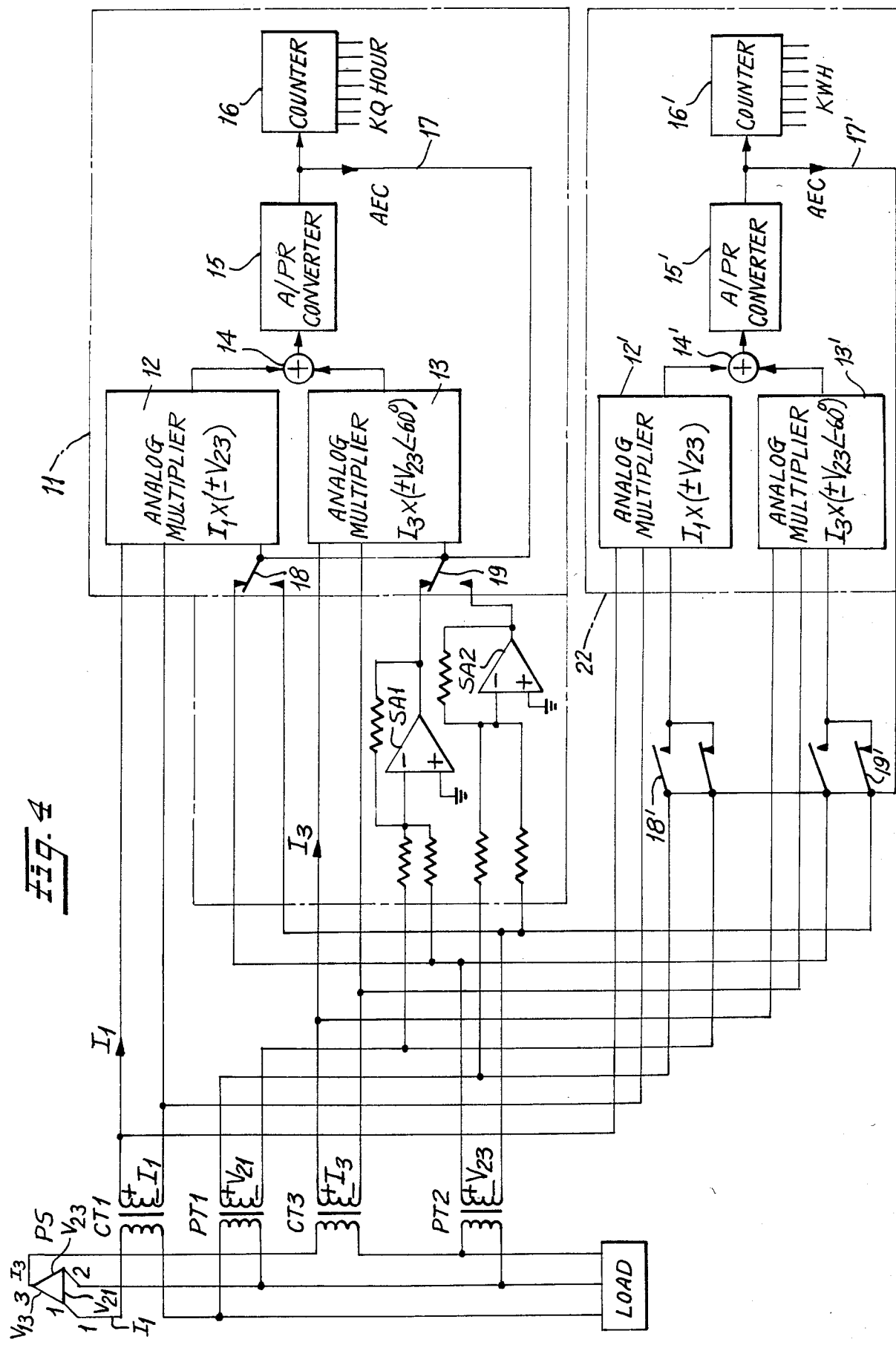

ELECTRONIC SOLID STATE Q-HOUR METER AND/OR COMBINATION Q-HOUR AND KILOWATT-HOUR METER

TECHNICAL FIELD

This invention relates to electronic solid state meters capable of fabrication substantially from solid state semiconductor components and capable of measuring power level electrical quantities.

More particularly, the invention relates to an electronic solid state Q meter for measuring leading and lagging VARS quantities of electric power and to a combination electronic solid state Q-hour and kilowatt-hour meter for measuring both leading and lagging VARS and kilowatt-hours quantities of electric energy being supplied from an electric power source.

BACKGROUND PRIOR ART

The Q-hour (or "quantity" hour) meter to a considerable extent fulfills the need of utilities, and other electrical power suppliers and users for equipments and techniques to produce the maximum amount of information in return for a minimal possible investment of dollars, space and weight. In survey work, as well as in revenue billing, electrical quantities other than kilowatts and/or kilowatt-hours need to be determined. Quantities such as reactive power and energy, kilovolt-amperes and kilovolt-ampere-hours, power factors and other similar measurements, often are needed to provide the utility, customer, etc., with necessary information relative to an electrical system operation.

With conventional techniques for the measurement of reactive power and energy, two VARS-hour meters and two phase-shifting transformers would be required if both lagging and leading VARS need to be determined. In the majority of cases, one Q-hour meter without requiring the use of phase-shifting transformers, can fully meet this requirement, thereby resulting in substantial savings in material space and installation costs. With the availability of computers in industry today, the calculation of reactive power from two other measured quantities (watts and Q) poses no problem.

Watts may be expressed as EI cos $\Theta$. When the proper voltages and currents are applied in a conventional motor-driven watt-hour meter, the torque produced on the meter is proportional to EI cos $\Theta$ defined as watts. The angle $\Theta$ is the power factor angle. In a similar fashion, reactive power is expressed as EI sin $\Theta$ or VARS. In as much as the watt-hour meter cannot directly recognize a sine function of an angle, a common method of measuring VARS (by means of a conventional motor-driven watt-hour meter) is to make use of a phase shifting transformer which displaces the voltage to the VAR-hour meter by ninety degrees. When the voltages to the meter for VAR measurement are displaced ninety degrees from the watt meter voltages, the conventional watt-hour meter then develops a torque proportional to EI cos (90°−$\Theta$) which may be shown to be equal to EI sin $\Theta$ or VARS. Voltages may be displaced either ninety degrees leading or ninety degrees lagging. Separate phase-shifting transformers and separate meters are required if both leading and lagging VARS are to be measured. It is this requirement that makes the Q-hour meter more desirable in both billing and survey recording systems.

A conventional Q-hour meter comprises a conventional motor-driven watt-hour meter in every detail. However, unlike the VAR-hour meter, a single Q-hour meter has the capability of measuring both leading and lagging VARS over some defined range of power factor. As noted above, a displacement of the watt-hour meter voltages by ninety degrees produces a value called VARS. By displacing the voltages any angle $\Theta$ (other than zero or ninety degrees), the torque on the motor driven watt-hour meter will not be proportional to watts or VARS, but will be proportional to a "quantity" called Q; thus a Q-hour meter. Conventional motor-driven Q-hour meters have been known to the industry for a period of time. It is a primary purpose of this invention to provide an elctronic solid state Q-hour meter which does not require the use of a third phase shifting potential transformer in order to meter Q hours.

SUMMARY OF INVENTION

It is therefore a primary object of the present invention to provide a new and improved electronic solid state meter capable of measuring either Q-hours or both Q-hours and kilowatt hours of electric energy being supplied from an electric power source.

Another object of the invention is to provide an electronic solid state meter having the above set forth capabilities which also includes an automatic error correction capability for automatically correcting for any long term offset errors which might arise during operation of the meter.

A still further object of the invention is to provide an electronic solid state Q-hour meter or combination Q-hour and kilowatt-hour meter having the above-set forth characteristics which can be fabricated for the most part in solid state semiconductor integrated circuit form.

In practicing the invention an elctronic solid state Q-hour meter for measuring leading and lagging VARS quantities of electric power over a defined range of power factors, is provided. The Q-hour meter comprises first and second time division/pulse width-amplitude modulated/analog multiplier circuits. First and second current transformers are coupled to first and second phases of a multi-phase power supply for deriving first and second analog current indicating signals indicative of the amplitude and phase of the currents flowing in the first and second phases, respectively. Means are provided for supplying the first and second analog current indicating signals to respective analog current input terminals to the first and second analog multiplier circuits, respectively. First and second potential transformers are coupled across the first and second phases of the multi-phase power supply for deriving first and second analog voltage indicating signals indicative of the amplitude and phase of the voltages across the first and second phases, respectively. Means are provided for supplying the first and second analog voltage indicating signals to respective analog voltage input terminals to the first and second analog multiplier circuits, respectively. Electronic phase shifting means are connected intermediate the output of one of the potential transformers and the input terminals to the analog multiplier circuit it supplies for shifting the phase of the voltage indicating signals supplied thereto sixty degrees lagging. The meter is completed by means for summing together the outputs of the analog multiplier circuits to derive an output analog signal representative of leading and lagging VARS quantities of electric power supplied from the multi-phase power source.

In preferred embodiments of the invention, the Q-hour meter further includes low pass filter and an analog to pulse rate converter circuit coupled to the output from the summing circuit. The analog to pulse rate converter circuit serves to effectively integrate the output analog signal and provides a pulsed output signal wherein each pulse represents a quantized unit of electric energy and wherein the repetition rate is determined by the amount of electric energy being measured at any given instant. A suitable display is coupled to the output from the analog to pulse rate converter circuit for providing an output indication of the quantity of leading and lagging VARS of electric energy being supplied from the multi-phase power supply.

The preferred form of electronic solid state Q-hour meter further includes an automatic error correction circuit connected intermediate the output from the analog to pulse rate converter circuit and the input to the respective first and second analog multiplier circuits. The automatic error correction circuit includes single-pole, double-throw switching devices connected to the analog voltage input terminals of the first and second analog multiplier circuits, respectively. The single-pole, double-throw switching devices are actuated by the output from the analog to pulse rate converter circuit with one of the single-pole, double-throw switching devices having its respective fixed double-throw terminals directly connected to opposite polarity terminals of the secondary winding of one of the first and second potential transformers, and the other of the single-pole, double-throw switching devices having its fixed double-throw terminals connected to the output from the sixty degree lagging electronic phase shifting circuit.

The electronic phase shifting circuit employed in the preferred form of electronic solid state Q-hour meter comprise first and second operational amplifiers for summing together a negative polarity first analog voltage indicating signal with a positive polarity second analog voltage indicating signal and deriving at its output a positive polarity analog voltage indicating signal phase shifted sixty degrees lagging relative to the analog voltage signals supplied directly to the analog multiplier circuit without phase shifting. The second operational amplifier serves to sum together a positive polarity analog first voltage indicating signal together with a negative polarity analog second voltage indicating signal to derive at its output a negative polarity voltage indicating signal phase shifted sixty degrees lagging relative to the analog voltage indicating signal supplied directly to the input of one of the analog multiplier circuits without phase shifting whereby alternate polarity voltage indicating signals are supplied by the respective single-pole, double-throw switching devices at the inputs to the respective anlog multiplier circuit and an averaging out of the offset errors inherently arising in the operation of the circuit is achieved over extended periods of operation of the meter.

A further feature of the invention is the provision of a combination electronic solid state Q-hour and kilowatt-hour meter which includes in combination an electronic solid state Q-hour meter having the characteristics described in the preceeding paragraphs and further including an electronic solid state KWH meter of known construction. The kilowatt-hour meter may be of the type described in U.S. Pat. No. 3,955,138 issued May 4, 1976 to Miran Milkovic, inventor—entitled "Electronic Energy Consumption Meter With Input Transformer Having Single Resistance Terminated Secondary Winding Coupled To C-MOS Switches Driven By Pulse Width Modulated Signals" and assigned to the General Electric Company, for example.

BRIEF DESCRIPTION OF DRAWINGS

Other objects, features, and many of the attendant advantages of this invention will become better understood upon a reading of the following detailed description, when considered in connection with the accompanying drawings, wherein like parts in each of the several figures are identified by the same reference character, and wherein:

FIG. 3 is a schematic circuit diagram and partial functional block diagram illustrating the construction of a novel electronic solid state Q-meter constructed according to the invention;

FIG. 4 is a schematic circuit diagram and partial functional block diagram of a novel combination, electronic solid state Q-hour and kilowatt-hour meter constructed according to the invention.

BEST MODE OF PRACTICING INVENTION

The principle of Q-metering is described more fully in an article entitled "Q-Metering" by C. E. Gambell appearing in the January, 1970 issue of Distribution Magazine, pages 9–12 published by the General Electric Company. While Q-metering as described in the Gambell article is defined as set forth above, for the purposes of this invention, Q-hour metering shall be defined as metering power consumption with the currents of each phase being measured as normally sensed without phase shift but with the voltage of each phase being phase shifted by sixty degrees lag. The mathemaical justification for this definition of Q-hour metering is set forth in the following description and constitutes the fundamental principle of operation of the present invention.

Figure 1:
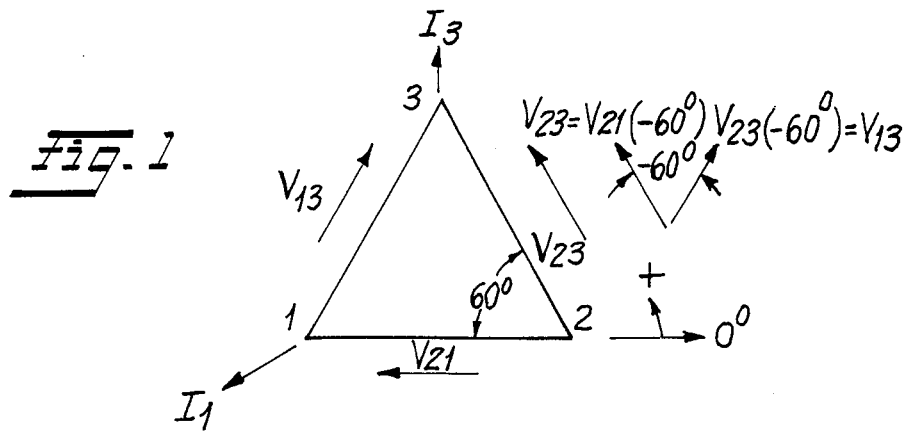
FIG. 1, FIG. 1A and FIG. 1B comprise a series of vector diagrams illustrating the vector addition of the various voltages being treated in the Q-meter according to the invention.

FIG. 1 is a phasor diagram which shows that in order to obtain a sixty degree lag phase shift of the voltage V21 (V21 lag sixty degrees), the voltage V23 is of the proper amplitude and phase. This will be readily appreciated from an examination of the simplified phasor diagram transposed to the right of the V23 phasor in FIG. 1.

Figure 1A:
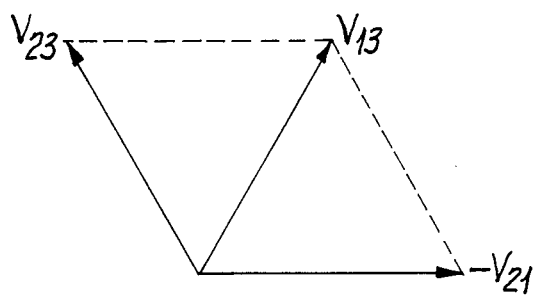
Figure 1B:
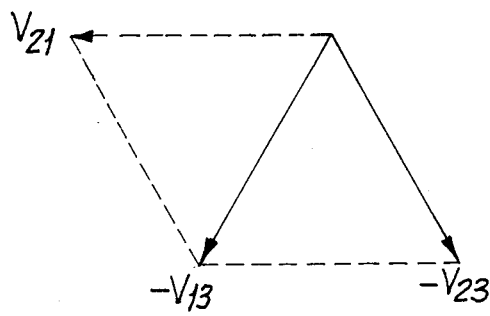

Further inspection of FIG. 1 will reveal that in order to derive a voltage which lags the voltage vector V23 by minus sixty degrees (V23 lag sixty degrees), the voltage vector V13 can be used. This can best be appreciated from the smaller simplified vector diagram transposed to the right of the voltage vector V23 shown in FIG. 1. However, with presently available solid state watt-hour metering components and subsystems, the voltage V13 is not available without the use of an additional potential transformer. This problem, however, is overcome in the present invention by adding the vector −V21 and +V23 or the vectors +V21 and −V23, in order to obtain the phasor V13 as shown in FIGS. 1A and 1B.

The above briefly described theoretical basis upon which the present invention operates can be proven mathematically in the following manner:

$$V21 = Vm \sin(wt + 180°) \qquad \text{Eq 1}$$

$$V23 = Vm \sin(wt + 120°) \qquad \text{Eq 2}$$

$$V23 \text{ (lag} - 60°) = V13 = -V21 + V23 \qquad \text{Eq 3}$$

By substituting equations 1 and 2 in equation 3 results in the following:

$$V23 \text{ (lag} -60°) = -Vm \sin(wt+180°) + Vm \sin(wt+120°)$$

$$V23 \text{ (lag} -60°) = -Vm [\sin(wt+180°) - \sin(wt+120°)]$$

Using the transform equation $$\sin X - \sin Y = 2 \sin\left(\frac{X-Y}{2}\right) \cos\left(\frac{X+Y}{2}\right)$$

to simplify, results in $$V23 \text{ (lag} - 60°) = -2Vm \left[\sin\left(\frac{wt + 180° - wt - 120°}{2}\right) \cos\left(\frac{wt + 180° + wt + 120°}{2}\right)\right]$$

$$V23 \text{ (lag} - 60°) = -2Vm \sin(30°) \cos(wt + 150°)$$

and since $\sin 30° = \frac{1}{2}$ $$V23 \text{ (lag} -60°) = -2Vm \left(\tfrac{1}{2}\right) \cos(wt+150°)$$

$$V23 \text{ (lag} -60°) = -Vm \sin(wt+240°)$$

$$V23 \text{ (lag} -60°) = Vm \sin(wt+60°) \qquad \text{Eq 4}$$

From a comparison of Equation 2 to Equation 1 it will be seen that the phasor V23 lags phasor V21 by 60°. By a similar comparison of Equation 4 to Equation 2 it will be seen that the phasor V23 (lag−60°) is lagging phasor V23 by 60°.

Figure 2:
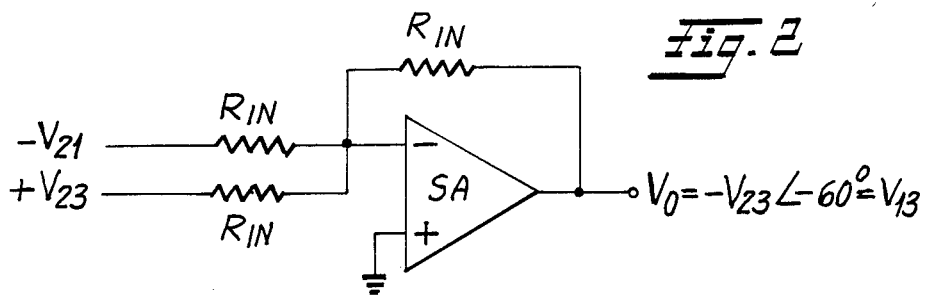
FIG. 2 and FIG. 2A are partial schematic functional block diagrams illustrating the construction of the electronic phase shifting circuits employed as a part of the Q-meter circuits shown in FIG. 3.
Figure 2A:
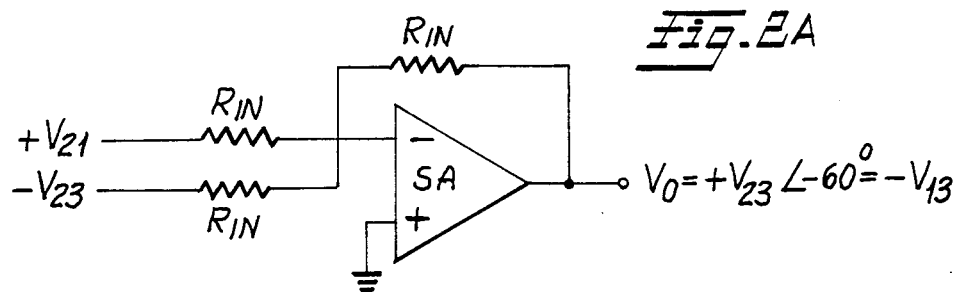

From Equation 3, as developed above, it is shown that by adding −V21 and +V23 with equal gains in an operational amplifier summing circuit, the output obtained will be V23 (lag −60°) A suitable operational amplifier circuit for performing this operation is shown in FIG. 2 of the drawings for developing the signal $Vo = -V23$ (lag −60°) = V13. FIG. 2A shows a similar operational amplifier summing circuit for summing together the voltages +V21 and −V23 to obtain an output signal $Vo = V23$ (lag −60°) = −V13. The phasor development of the voltages +V13 and −V13 are shown in FIGS. 1A and 1B. The purpose for developing these output voltages will be better appreciated from the following description of FIG. 3 of the drawings wherein it will be seen that the terms are required in the operation of the automatic error correction circuitry portion of the Q-hour meter shown in FIG. 3. The value Vo obtained from the summing operational amplifier circuit shown in FIG. 2A can be shown to be as follows:

$$V_o = \frac{-Rin}{Rin}(-V21) + \frac{-Rin}{Rin}(V23) \qquad \text{Eq 5}$$

$$V_o = V21 - V23$$

$$V_o = -V23 \text{ (lag} -60°) = V13$$

A similar set of expressions can be derived for the output Vo of the summing operational amplifier circuitry shown in FIG. 2A:

$$V_o = +V23 \text{ (lag} -60°) = -V13$$

FIG. 3 is a schematic functional block diagram of a novel electronic solid state Q-hour meter constructed according to the invention. The Q-hour meter shown in FIG. 3 is a two element meter in that it employs two multiplier elements together with their associated input and output components such as two current transformers and two potential transformers. The Q-hour meter is comprised by a subsystem 11 formed by first and second time division/pulse width-amplitude modulated/analog multiplier circuits 12 and 13, respectively. The first and second multiplier circuits 12 and 13 are identical, are of known construction and operation and will be described more fully hereafter with relation to FIG. 5 of the drawings. Briefly, however, it can be stated that each multiplier has respective current indicating signal and voltage indicating signal input terminals and an output terminal. The current indicating signal input terminals to multiplier 12 are supplied with the current indicating signal I1 from the secondary winding of a current transformer CT1 whose primary is connected in the current path of phase 1 of a three phase power supply source PS. The voltage indicating signal input terminal of multiplier 12 is connected through a polarity reversing switch 18 (to be described hereafter) across opposite polarity terminals of the secondary winding of a potential transformer PT2 whose primary winding is connected across phase 2 of power supply PS. Multiplier 13 has its current indicating signal input terminals supplied with a current indicating I3 signal supplied from the secondary winding of a current transformer CT3 having its primary connected to measure the current in phase 3 of the three phase power supply PS.

The voltage indicating signal input terminals of multiplier 13 are connected through a polarity reversing switch 19 (to be described hereafter) to respective output terminals from summing operational amplifiers SA1 and SA2. SA1 and SA2 correspond to the summing operational amplifiers shown in FIGS. 2 and 2A, respectively. Summing operational amplifier SA1 has supplied to its negative input terminal the negative polarity voltage indicating signal −V21 obtained from the secondary winding of voltage transformer PT1 and the positive polarity voltage indicating signal +V23 obtained from the secondary winding of voltage transformer PT2. The summing operational amplifier SA2 has supplied to its negative input terminal the positive polarity voltage indicating signal +V21 and the negative polarity voltage indicating signal −V23. In operation, the summing operational amplifiers SA1 and SA2 function to develop at their respective outputs the voltages $Vo = -V23$ (lag −60°) and $Vo = +V23$ (lag −60°)

as developed in Equation 1-5 and explained further with respect to FIGS. 1, 1A and 1B.

Multiplier 12 serve to multiply together the terms I1 representing the first current indicating signal and the term $-V23$ (lag $-60°$) and to derive at its output a time division/pulse width-amplitude modulated/analog signal $Q1=(V21$ lag $-60°)\times I1$ representative of a partial Q value of electrical energy being measured. Multiplier 13 operates to multiply the terms $I3\times(V23$ lag $-60°)$ and develop at its output a time division/pulse width amplitude modulated/analog signal Q2 representative of the remaining partial Q value of electric energy being measured as will be explained more fully hereafter with respect to the development of the mathematical expressions for the operation of the Q-hour meter. The Q1 and Q2 analog signals are summed together in a summing circuit 14 whose output then represents the total Q leading and lagging VARS quantities of electric power being supplied from the multi-phase power supply PS.

The total VARS quantity of electric energy signal obtained from the output from summing circuit 14 is supplied to an analog to pulse rate converter 15 whose construction and operation will be explained more fully hereafter with respect to FIG. 5 of the drawings and which serves to develop a series of output pulses wherein each pulse represents a quantitized unit of electric energy, and the total number of pulses integrated over a given unit of time is representative of the VARS quantities of electric energy being measured. This quantized, pulsed output signal from analog to pulse rate converter 15 is supplied to a suitable counter 16 which can be used to display the kilo Q VARS hours of electric energy being consumed. This counter may be located on site or alternatively the quantized pulse signal may be supplied over suitable transmission facilities to a remotely located monitoring station.

The quantized pulsed signal appearing at the output of analog to pulse rate converter 15 also is supplied back over a feedback connection 17 to control the switching action of a set of first and second single-pole, double-throw switching devices 18 and 19 connected to the voltage indicating signal inputs to analog multipliers 12 and 13, respectively. The switching devices 18 and 19, while shown as manual switching devices, in practice would constitute solid state, semiconductor switching devices such as C-MOS switching devices sold commercially as discrete devices or alternatively could be integrally formed in a monolithic integrated circuit together with the other circuit components of the meter. The switches would be switched to one of their double-throw conditions, for example to the upper contact as shown in FIG. 3, with the pulsed output from converter 15 at one level, say for example a low level, and then switched to the second double-throw position, i.e. the lower contact, upon the output from A/PR converter 15 switching to its high level. As a result of this switching action, alternate polarity values of V23 ($+$ or $-V23$) and (V23 lag $-60°$)+ or $-$(V23 lag $-60°$) are applied to the voltage indicating signal inputs of multipliers 12 and 13, respectively. This switching action occurs at a switching rate higher than the normal 60 hertz frequency of power supply source PS but at a much lower switching frequency than the operation of the analog multipliers 12 and 13 as will be explained hereafter with respect to FIG. 5. As a result of the switching of the polarity of the voltage indicating signals supplied to multipliers 12 and 13, any offset error occuring in the metering system is averaged out over each operaating cycle of the power supply source PS thus improving accuracy of the reading. For a more detailed description of the operation of this automatic error correction circuitry, reference is made to the above referenced U.S. Pat. No. 3,955,138 issued May 4, 1976, the disclosure of which is hereby incorporated into the disclosure of this application in its entirety.

The equations expressing the operation of the novel electronic solid state Q-hour meter shown in FIG. 3, are as follows:

$$Q=Q_1'+Q_2' \qquad \text{Eq 6}$$

where $Q_1'$ is the output of analog multiplier 12 and $Q_2'$ is the output of multiplier 13;

$$Q_1'=(V21 \text{ lag}-60°)\times(I1) \qquad \text{Eq 7}$$

$$Q_2'=(V23 \text{ lag}-60°)\times(I3) \qquad \text{Eq 8}$$

$$I1=Im \sin(wt+210°+\Theta) \qquad \text{Eq 9}$$

$$I3=Im \sin(wt+90°+\Theta) \qquad \text{Eq 10}$$

$$(V21 \text{ lag}-60°)=Vm \sin(wt+120°) \qquad \text{Eq 11}$$

$$(V23 \text{ lag}-60°)=Vm \sin(wt+60°) \qquad \text{Eq 12}$$

Substituting Equations 7-12 in Equation 6 results in the following;

$$Q=Vm\ Im \sin(wt+210°+\Theta)\sin(wt+120°)+Vm\ Im \sin(wt+90°+\Theta)\sin(wt+60°) \quad \text{Eq 13}$$

Simplifying Equation 13 results in:

$$Q = \tfrac{1}{2}Vm\ Im\ \cos(wt + 210° + \theta - wt - 120°) - \\ \cos(wt + 210° + \theta + wt + 120°) + \\ \cos(wt + 90° + \theta - wt - 60°) - \\ \cos(wt + 90° + \theta + wt + 60°) \quad \text{Eq 14}$$

Simplifying Equation 14 results in;

$$Q=\tfrac{1}{2}Vm\ Im\ \cos(90°+\Theta)-\cos(2wt+330°+\Theta)+\cos(30°+\Theta)-\cos(2wt+150°+\Theta) \qquad \text{Eq 15}$$

Simplifying Equation 15 by using the transformation $$\cos(2wt+330°+\Theta)=\cos(2wt+180°+150°+\Theta)=-\cos(2wt+150°+\Theta)$$

results in;

$$Q=\tfrac{1}{2}Vm\ Im\ \cos(90°+\Theta)+\cos(30°+\Theta) \qquad \text{Eq 16}$$

Simplifying Equation 16 using the transform function $$\cos x + \cos y = 2\cos\left(\frac{X+Y}{2}\right)\cos\left(\frac{X-Y}{2}\right)$$

results in;

$$Q = \frac{2}{2} \, Vm \, Im \left[\cos\left(\frac{90° + \theta + 30° + \theta}{2}\right) \cos\left(\frac{90° + \theta - 30° - \theta}{2}\right)\right] \quad \text{Eq 17}$$

$$Q = Vm \, Im \, \cos(60° + \theta) \cos(30°) \quad \text{Eq 18}$$

keeping in mind that cos (30°)=3/2 Equation 18 can be simplified to:

$$Q = 3/2 \, Vm \, Im \, \cos(60° + \Theta) \quad \text{Eq 19}$$

Using the transform function $\cos(x+y) = \cos x \cos y - \sin x \sin y$, then Equation 19 can be simplified to read;

$$Q = \frac{3}{2} \, Vm \, Im \, \cos(60°) \cos(\theta) - \sin(60°)\sin\theta] \quad \text{Eq 20}$$

$$Q = \frac{3}{2} \, VmIm \, \cos(\theta) \cos(60°) - \quad \text{Eq 21}$$

$$\frac{3}{2} \, Vm \, Im \, \sin(\theta) \sin(60°)$$

The first term of Equation 21 represents the watts of electric energy being measured at a phase angle other than 0 or 90 and the second term represents the VARS of electric energy at the selected phase angle other than 0 or 90 and effectively is the same equation as that as shown in the above-identified article entitled "Q-Metering" by C. E. Gambell published in the January, 1970 issue of Distribution magazine. However, due to the difference of expressing lag as positive, the VARS in the Gambell article came out at a positive angle.

Figure 5:
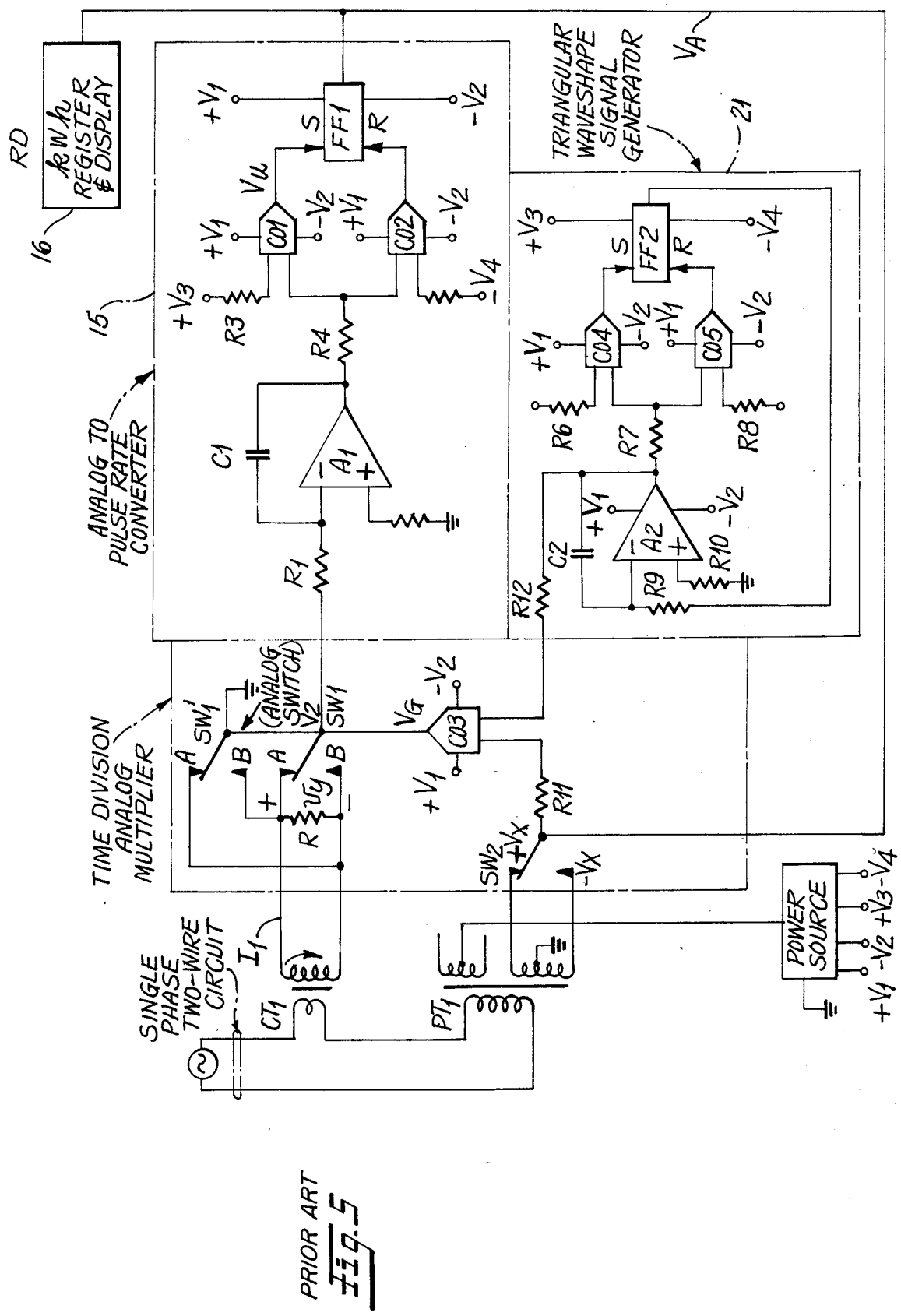
FIG. 5 is a schematic circuit diagram of a prior art, known, electronic solid state kilowatt-hour meter employed in the combination Q-hour meter and kilowatt-hour meter shown in FIG. 4, and illustrates the construction of the time division/pulse width-amplitude modulated analog multiplier circuit used in the Q meter.

FIG. 5 is a schematic functional diagram illustrating the construction of the analog multipliers 12 and 13 employed in the Q-hour meter of FIG. 1. The analog multiplier also includes a triangular waveshape signal generator which is par of the analog multiplier illustrated in block diagram form in FIG. 1. FIG. 5 also further shows the analog to pulse rate converter 15 and kilowatt hour register and display 16 comprising a part of an electronic, solid state kilowatt hour meter such as are described in U.S. Pat. Nos. 3,955,138 and 4,066,959 and 4,066,960. In fact, FIG. 5 corresponds almost identically to FIG. 4 of U.S. Pat. No. 3,955,138. For a more detailed description of the construction and operation of the analog multiplier, reference is made to the disclosure of that patent. For the purpose of the present disclosure, the following brief description of the construction and operation of the analog multiplier is believed adequate.

The time division analog multipliers 12 and 13 are identical in construction and operation and hence, only the details of construction of one of the multipliers will be described, it being understood that the description also applies with equal force to the remaining analog multiplier. The analog multipliers are comprised by a comparator CO3 which has supplied to one of its inputs the voltage indicating signal from a potential transformer such as PT1 through a single-pole, double-throw automatic error correction reversing switch SW2. The remaining terminal of the comparator CO3 is supplied with a triangular waveshape signal from a triangular waveshape signal generator comprised by the comparators CO4, CO5 FF2 and operational amplifier A2. Comparator CO3 functions as a pulse-width modulator to produce at its output terminal a voltage VG which is pulse width modulated and whose pulse width is determined by the amplitude of the voltage indicating signal supplied through polarity reversing switch SW2 to one of the voltage input terminals to the analog multiplier.

The time division analog multiplier is further comprised by a set of single-pole, double-throw multiplier switching devices which again may comprise solid state, semiconductor switching devices SW1 and SW1' of the C-MOS type fabricated either in discrete or interated circuit form. The first and second modulator switching devices SW1 and SW1' comprise single-pole, double-throw switching devices wherein the fixed double-throw terminals A and B of each set of switching devices are connected with opposite polarity across the current indicating signal input supply circuit comprised by a resistor R connected across the secondary winding of current transformer CT1. As a result of this arrangement, the fixed double-throw terminals A of SW1 and B of SW1' have applied thereto a positive polarity current indicating signal +I1 and fixed double-throw terminals B of SW1 and A of SW1' have supplied thereto a negative polarity current indicating signal −I1. It will be appreciated that the current indicating signals are in fact voltage signals derived across the resistor R but of course are proportional to the current I flowing in the primary winding of current transformer CT1. The movable pole of switching device SW1' is grounded while the movable pole of switching device SW1 constitutes the output terminal for the time division analog multiplier and is connected through the resistor R1 to the input of the analog to pulse rate converter 15.

In operation, the analog switching devices SW1 and SW1' will be switched at the pulse rate of the triangular waveshape generator 21. This is usually about 6 kilohertz or more. The output VG from pulse width multiplier CO3 is a pulse-width modulated pulse train having a pulse width proportional to the amplitude + or −VX and a frequency fs determined by the frequency of the triangular wave generator. The signal + or − VX is proportional to the line voltage and the signal + or − VY appearing across resistor R is proportional to the current flowing in the primary winding of current transformer CT1. The multiplier output signal VZ is obtained by modulating + or − VY with VG. The phase inverted signal + or − VY required for proper multiplication is obtained as described above with the interconnections of the fixed double-throw contacts A and B of switches SW1 and SW1'. Since the sampling frequency fs of about 6 kilohertz or more is much larger than the line frequency f1, the output signal VZ will be a time division/pulse-width modulated/amplitude modulated analog signal which is supplied as an input to the analog to pulse rate converter 15 comprised by operational amplifier A1, comparators CO1 and CO2 and flip-flop FF1. Since the pulse time interval is a function of the line voltage indicating signal VX and the amplitude is a function of the current indicating signal vy it is apparent that vz is proportional to the product of vz and vy.

FIG. 4 is a schematic functional diagram of a combination electronic solid state Q-hour meter and kilowatt-hour meter. In FIG. 4, the Q-hour meter portion of the combination circuit is shown at 11 and is constructed and operates identically to the Q-hour meter described with relation to FIG. 3 of the drawings.

The kilowatt-hour meter portion of the combination mete is shown at 22 and includes third and fourth time division/pulse-width/amplitude modulated analog multiplier circuits 12' and 13', respectively. The analog multiplier circuits are identical in construction and operation to the analog multiplier shown and described with relation to FIG. 5 and supply their output to a summing circuit 14'. Summing circuit 14' supplies its output to an analog to pulse rate converter 15' which serves to develop at its output a pulsed signal each pulse of which represents a quantized unit of in-phase power measured in kilowatt hours which is displayed on a counter 16'. The summing circuit 14', analog to pulse rate converter 15' and display counter 16' all are similar to and function in the same manner to the corresponding numbered elements shown in the Q-hour meter portion of the circuit 11.

The output from the analog to pulse rate converter 15' is fed back through an automatic error correction feedback conductor 17' to control the switching operation of a set of double-pole, double-throw switching devices 18' and 19'. Here again while the switching devices 18' and 19' are illustrated as electric switches, they would in actuality constitute C-MOS solid state semiconductor devices either in discrete form or integrated circuit form and are under the control of the pulsed output signal from the analog to pulse rate converter 15' supplied back over conductor 17'. As shown in FIG. 4, the switching devices 18' and 19' are arranged such that in one state the lower movable contact is closed on its fixed contact while the upper movable contact is open. In the second state of the switches, the reverse condition would prevail with the upper movable contacts being closed on its respective fixed contact while the lower movable contact would be open. By this arrangement, reverse polarity input voltage indicating signals are supplied to the voltage indicating signal input terminal of analog multiplier 12' which are representative of + and − V21. Similarly, alternate polarity signals representative of + and − V23 are supplied through switching device 19' to the voltage indicating signal input terminal of analog multiplier 13'. In operation, the kilowatt-hour meter 22 together with its automatic error correction polarity reversing switches 18' and 19' will function identically to the circuit shown and described with relation to FIG. 5 to develop at the output counter 16' an indication representative of the kilowatt hours of electric energy being measured.

INDUSTRIAL APPLICABILITY

The invention describes a low cost, electronic, solid state semiconductor Q-hour meter and/or a combination Q-hour and kilowatt-hour meter which is susceptible to being manufactured from solid state semiconductor components in integrated circuit form. The meter can be used for measuring leading and lagging VARS quantities of electric power as well as kilowatt-hour quantities of electric energy being supplied from an electric power source.

The meter also includes an automatic error correction capability for automatically correcting long term offset errors that might arise during operation and reducing them substantially to zero. The meter as designed is capable of being fabricated for the most part in solid state, semiconductor integrated circuit form.

Having described two embodiments of an electronic solid state Q-hour meter and/or combination Q-hour and kilowatt-hour meter constructed in accordance with the invention, it is believed obvious that other modifications and variations of the invention will be suggested to those skilled in the art in the light of the above teachings. It is therefore to be understood that the changes may be made in the particular embodiments of the invention described which are within the full intended scope of the invention as defined by the appended claims.

What is claimed is:

1. An electronic solid state Q-hour meter is measuring leading and lagging VARS quantities of electric power consumed for a three-phase power supply having first, second and third phases for a defined range of power factor, said Q-hour meter comprising first and second time division/pulse width-amplitude modulated/analog multiplier circuit means; first and second current transformer means coupled to first and third phases of the three-phase power supply for deriving first and second analog current indicating signals indicative of the amplitude and phase of the currents flowing in said first and third phases, respectively; means for supplying said first and second analog current indicating signals to respective analog current input terminals to said first and second analog multiplier circuit means, respectively; first and second potential transformer means coupled across said first and second phases and said second and third phases of said three-phase power supply for deriving first and second analog voltage indicating signals indicative of the amplitude and phase of the voltages across said first and second and said second and third phases, respectively; means for supplying said first and second analog voltage indicating signals to respective analog voltage input terminals to said first and second analog multiplier circuits means respectively; electronic phase adjusting means connected intermediate the output of one of said potential transformer means and the voltage input terminals to the analog multiplier circuit means it supplies for introducing a phase shift in the phase of the voltage indicating signal supplied thereto sixty degrees lagging relative to the voltage indicating signal supplied to the opposite analog multiplier circuit means; and means for summing together the outputs of the analog multiplier circuit means to derive an output analog signal representative of leading and lagging VARS quantities of electric power supplied from the three-phase power supply.

2. An electronic solid state Q-hour meter according to claim 1 wherein the electronic phase adjusting means comprises second summing circuit means for summing together a first polarity analog voltage indicating signal with an opposite polarity second analog voltage indicating signal and deriving at its output the analog voltage indicating signal phase shifted sixty degrees lagging relative to the analog voltage signal supplied directly to the opposite analog multiplier circuit means.

3. An electronic solid state Q-hour meter according to claim 2 wherein said meter further includes low pass filter and analog to pulse rate converter circuit means coupled to the output from said first mentioned summing circuit means, said analog to pulse rate converter circuit means serving to effectively integrate the output analog signal and provide a pulsed output signal with each pulse representing a quantized unit of energy and whose repetition rate is determined by the amount of energy being measured at a given instant; and display means coupled to the output from the analog to pulse rate coverter circuit means for providing an output indication of the quantity of leading and lagging VARS of electric energy being supplied from the third-phase power supply and wherein the meter further includes automatic error correction circuit means connected intermediate the output from the analog to pulse rate converter circuit means and the input to the respective first and second analog multiplier circuit means, said automatic error correction circuit means including single-pole, double-throw switch means connected to the analog voltage input terminals to the first and second analog multiplier circuit means, respectively, with said single-pole, double-throw switching means being actuated by the output from said analog to pulse rate converter circuit means, the single-pole, double-throw switch means connected to one of the analog multiplier circuit means having its respective fixed double throw terminals directly connected to opposite polarity terminals of the secondary winding of one of the first and second potential transformer means and the other of the single-pole, double-throw switch means having its fixed double-throw terminals connected to the output of the sixty degree lagging electronic phase adjusting circuit means which supplies respective positive polarity and negative polarity sixty degree lagging phase shifted voltages to the respective fixed double-throw contacts of said other remaining single-pole, double-throw switch means.

4. An electronic solid state Q-hour meter according to claim 3 wherein the electronic phase adjusting means comprises first and second operational amplifiers for summing together a negative polarity first analog voltage indicating signal with a positive polarity second analog voltage indicating signal and deriving at its output a positive polarity analog voltage indicating signal phase shifted sixty degrees lagging relative to the analog voltage signal supplied directly to the opposite analog multiplier circuit without phase shifting and said second operational amplifier serving to sum together a positive polarity analog first voltage indicating signal together with a negative polarity analog second voltage indicating signal to derive at its output a negative polarity voltage indicating signal phase shifted sixty degrees lagging relative to the analog voltage indicating signal supplied directly to the input of the opposite one of the analog multiplier circuit means without phase shifting whereby alternate polarity voltage indicating signals are supplied by the respective single-pole, double-throw switching means to the respective analog multiplier circuit means and an averaging out of offset errors inherently arising in the operation of the circuit is achieved over extended periods of operation of the meter.

5. An electronic solid state Q-hour meter according to claim 1 wherein each of the time-division/pulse width-amplitude modulated/analog multiplier circuit means comprises pulse width modulator circuit means having one input supplied from a triangular waveshape signal generator means and a second input supplied with an input signal indicative of one of the operating characteristics being measured and for deriving at its output a pulse width modulated signal whose pulse width is determined by the value of the characteristic being measured supplied as one of the inputs to the pulse width modulator, first and second sets of multiplier single-pole, double-throw switch means whose switching action is controlled by the output from the pulse width modulator circuit means, the fixed double-throw terminals of each set of multiplier single-pole, double-throw switch means being connected with opposite polarity across the remaining operating characteristic to be measured signal input supply circuit for multiplying the remaining operating characteristic to be measured by the operating characteristic supplied to the pulse width modulator, the movable pole of one of the multiplier switch means being connected to ground and the movable pole of the remaining multiplier switch means comprising the output terminal of the analog multiplier circuit means.

6. An electronic solid state Q-hour meter according to claim 5 wherein said meter further includes low pass filter and analog to pulse rate converter circuit means coupled to the output from said summing circuit means, said analog to pulse rate converter circuit means serving to effectively integrate the output analog signal and provide a pulsed output signal with each pulse representing a quantized unit of energy and whose repetition rate is determined by the amount of energy being measured at an given instant; and display means coupled to the output from the analog to pulse rate converter circuit means for providing an output indication of the quantity of leading and lagging VARS of electric energy being supplied from the multi-phase power supply at any given time.

7. An electronic solid state Q-hour meter according to claim 6 wherein the meter further includes automatic error correction circuit means connected intermediate the output from the analog to pulse rate converter circuit means and the input to the respective first and second analog multiplier circuit means, said automatic error correction circuit means including single-pole, double-throw switch means connected to the analog voltage input terminals to the first and second analog multiplier circuit means, respectively, with said single-pole, double-throw switching means being actuated by the output from said analog to pulse rate converter circuit means, the single-pole, double-throw switch means connected to one of the analog multiplier circuit means having its respective fixed double throw terminals directly connected to opposite polarity terminals of the secondary winding of one of the first and second potential transformer means and the other of the single-pole, double-throw switch means having its fixed double-throw terminals connected to the output of the sixty degree lagging electronic phase adjusting circuit means which supplies respective positive polarity and negative polarity sixty degree lagging phase shifted voltages to the respective fixed double throw contacts of said other remaining single-pole, double-throw switch means.

8. An electronic solid state Q-hour meter according to claim 7 wherein the electronic phase adjusting means comprises first and second operational amplifiers for summing together a negative polarity first analog voltage indicating signal with a positive polarity second analog voltage indicating signal and deriving at its output a positive polarity analog voltage indicating signal phase shifted sixty degrees lagging relative to the analog voltage signal supplied directly to the opposite analog multiplier circuit without phase shifting and said second operational amplifier serving to sum together a positive polarity analog first voltage indicating signal together with a negative polarity analog second voltage indicating signal to derive at its output a negative polarity voltage indicating signal phase shifted sixty degrees lagging relative to the analog voltage indicating signal supplied directly to the input of the opposite analog multiplier circuit means without phase shifting whereby alternate polarity voltage indicating signals are supplied by the respective single-pole, double-throw switching means to the respective analog multiplier circuit means and an averaging out of offset errors inherently arising in the operation of the circuit is achieved over extended periods of operation of the meter.

9. A combination electronic solid state Q-hour and kilowatt-hour meter including in combination an electronic solid state Q-hour meter according to claim 1 and further including an electronic solid state kilowatt-hour meter comprised by third and fourth time-division/pulse width-amplitude modulated/analog multiplier circuit means; means for supplying the first analog current indicating signal and the first analog voltage indicating signal directly to the respective current and voltage input terminals of the third analog multiplier circuit means without phase shift; means for supplying the second analog current indicating signal and the second analog voltage indicating signal directly to the respective analog current and analog voltage input terminals of the fourth analog multiplier circuit means connected to the outputs from said third and fourth multiplier circuit means for deriving an output analog signal representative of the kilowatt hours of electric power supplied from the multi-phase power supply.

10. A combination electronic solid state Q-hour and kilowatt-hour meter according to claim 9 wherein said meter further includes respective low pass filter and analog to pulse rate converter circuit means coupled to the output from the respective summing circuit means, said respective analog to pulse rate converter circuit means serving to effectively integrate the respective output analog signals and provide respective pulsed output signals with each pulse representing a quantized unit of energy and whose repetition rate is determined by the amount of energy being measured at a given instant; and display means coupled to the respective output terminals from the analog to pulse rate converter circuit means for providing an output indication of the quantity of leading and lagging VARS and kilowatt hours of electric energy being supplied from the multi-phase power supply.

11. A combination electronic solid state Q-hour and kilowatt-hour meter according to claim 10 wherein the meter further includes automatic error correction circuit means connected intermediate the output from the respective analog to pulse rate converter circuit means and the input to the respective first and second analog multiplier circuit means and the respective third and fourth analog multiplier circuit means, respectively, said automatic error correction circuit means including single-pole, double-throw switch means connected to the analog voltage input terminals to the first and second and the third and fourth analog multiplier circuit means, respectively, with said single-pole, double-throw switch means being actuated by the output from said respective analog to pulse rate converter circuit means, one of the single-pole, double-throw switch means of the Q-meter being connected to one of the analog multiplier circuit means having its respective fixed double-throw terminals directly connected to opposite polarity terminals of the secondary winding of one of the first and second potential transformer means and the other of the single-pole, double-throw switch means of the Q-meter having its fixed double-throw terminals connected to the output of the sixty degree lagging electronic phase adjusting circuit means which supplies respective positive polarity and negative polarity sixty degree lagging phase shifted voltages to the respective fixed double-throw contacts of said other remaining single-pole, double-throw switch means.

12. A combination electronic solid state Q-hour meter according to claim 11 wherein the electronic phase adjusting means comprises first and second operational amplifiers for summing together a negative polarity first analog voltage indicating signal with a positive polarity second analog voltage indicating signal and deriving at its output a positive polarity analog voltage indicating signal phase shifted sixty degrees lagging relative to the analog voltage signal supplied directly to the opposite analog multiplier circuit without phase shifting and said second operational amplifier serving to sum together a positive polarity analog first voltage indicating signal together with a negative polarity analog second voltage indicating signal to derive at its output a negative polarity voltage indicating signal phase shifted sixty degrees lagging relative to the analog voltage indicating signal supplied directly to the input of the opposite analog multiplier circuit means without phase shifting whereby alternate polarity voltage indicating signals are supplied by the respective single-pole, double-throw switching means of the Q-meter to the respective analog multiplier circuit means of the Q-meter and an averaging out of offset errors inherently arising in the operation of the circuit is achieved over extended periods of operation of the meter.

13. A combination electronic solid state Q-hour and kilowatt-hour meter according to claim 9 wherein each of the time-division/pulse width-amplitude modulated/analog multiplier circuit means comprises pulse width modulator circuit means having one input supplied from a triangular waveshape signal generator means and a second input supplied with an input signal indicative of one of the operating characteristics being measured and for deriving at its output a pulse width modulated signal whose pulse width is determined by the value of the characteristic being measured supplied as one of the inputs to the pulse width modulator, first and second sets of multiplier single-pole, double-throw switch mean whose switching action is controlled by the output from the pulse width modulator circuit means, the fixed double-throw terminals of each set of multiplier single-pole, double-throw switch means being connected with opposite polarity across the remaining operating characteristic to be measured signal input supply circuit for multiplying the remaining operating characteristic to be measured by the operating characteristic supplied to the pulse width multiplier, the movable pole of one of the multiplier switch means being connected to ground and the movable pole of the remaining multiplier switch means comprising the output terminal of the analog multiplier circuit means.

14. A combination electronic solid state Q-hour and kilowatt-hour meter according to claim 13 wherein said meter further includes respective low pass filter and analog to pulse rate converter circuit means coupled to the output from the respective summing circuit means, said respective analog to pulse rate converter circuit means serving to effectively integrate the respective output analog signals and provide a pulsed output signal with each pulse representing a quantized unit of energy and whose repetition rate is determined by the amount of energy being measured at an given instant; and display means coupled to the respective output terminals from the analog to pulse rate converter circuit means for providing an output indication of the quantity of leading and lagging VARS and kilowatt hours of electric energy being supplied from the multi-phase power supply.

15. A combination electronic solid state Q-hour and kilowatt-hour meter according to claim 14 wherein the meter further includes automatic error correction circuit means connected intermediate the output from the respective analog to pulse rate converter circuit means and the input to the respective first and second analog multiplier circuit means and the respective third and fourth analog multiplier circuit means, respectively, said automatic error correction circuit means including single-pole, double-throw switch means connected to the analog voltage input terminals to the first and second and third and fourth analog multiplier circuit means, respectively, with said single-pole, double-throw switch means being actuated by the output from said respective analog to pulse rate converter circuit means, one of the single-pole, double-throw switch means of the Q-meter being connected to one of the analog multiplier circuit means having its respective fixed double-throw terminals directly connected to opposite polarity terminals of the secondary winding of one of the first and second potential transformer means and the other of the single-pole, double-throw switch means of the Q-meter having its fixed double-throw terminals connected to the output of the sixty degree lagging electronic phase adjusting circuit means which supplies respective positive polarity and negative polarity sixty degree lagging phase shifted voltages to the respective fixed double-throw contacts of said other remaining single-pole, double-throw switch means.

16. A combination electronic solid state Q-hour and kilowatt-hour meter according to claim 15 wherein the electronic phase adjusting means comprises first and second operational amplifiers for summing together a negative polarity first analog voltage indicating signal with a positive polarity second analog voltage indicating signal and deriving at its output a positive polarity analog voltage indicating signal phase shifted sixty degrees lagging relative to the analog voltage signal supplied directly to the opposite analog multiplier circuit without phase shifting and said second operational amplifier serving to sum together a positive polarity analog first voltage indicating signal together with a negative polarity analog second voltage indicating signal to derive at its output a negative polarity voltage indicating signal phase shifted sixty degrees lagging relative to the analog voltage indicating signal supplied directly to the input of the opposite analog multiplier circuit means without phase shifting whereby alternate polarity voltage indicating signals are supplied by the respective single-pole, double-throw switch means to the respective analog multiplier circuit means of the Q-meter and an averaging out of offset errors inherently arising in the operation of the circuit is achieved over extended periods of operation of the meter.

* * * * *